United States Patent [19]

Takeuchi et al.

[11] Patent Number: 4,605,813

[45] Date of Patent: Aug. 12, 1986

[54] AMORPHOUS SILICON SOLAR BATTERY

[75] Inventors: Yukihisa Takeuchi, Chita; Masaaki Mori, Bisai; Kenji Maekawa, Kariya; Toshiaki Nishizawa, Ohbu, all of Japan

[73] Assignee: Nippondenso Co., Ltd., Kariya, Japan

[21] Appl. No.: 754,201

[22] Filed: Jul. 11, 1985

Related U.S. Application Data

[63] Continuation of Ser. No. 533,813, Sep. 19, 1983, abandoned.

[30] Foreign Application Priority Data

Sep. 29, 1982 [JP] Japan .............................. 57-170770

[51] Int. Cl.[4] ..................... H01L 27/14; H01L 31/06
[52] U.S. Cl. .................................... 136/244; 136/256; 136/258; 180/2.2; 180/65.3
[58] Field of Search ....... 136/244, 245, 256, 258 AM; 180/2.2, 65.3

[56] References Cited

U.S. PATENT DOCUMENTS

| | | | |
|---|---|---|---|
| 3,370,986 | 2/1968 | Amsterdam et al. | 136/244 |
| 3,943,726 | 3/1976 | Miller | 62/2 |
| 4,400,409 | 8/1983 | Izu et al. | 427/39 |
| 4,410,558 | 10/1983 | Izu et al. | 427/39 |
| 4,442,310 | 4/1984 | Carlson et al. | 136/256 |
| 4,450,316 | 5/1984 | Hamakawa et al. | 136/256 |

Primary Examiner—Aaron Weisstuch
Attorney, Agent, or Firm—Cushman, Darby & Cushman

[57] ABSTRACT

A flexible amorphous silicon solar battery comprising a metal foil as the substrate thereof, an insulating layer integrally formed on the metal foil, and at least one amorphous silicon photoelectric conversion portion formed on the insulating layer. The amorphous silicon photoelectric conversion portion thereof comprises an a-Si thin film having a potential barrier therein, an upper electrode and a lower electrode. The a-Si thin film is sandwiched between the upper and lower electrodes. The upper electrodes may be formed of a transparent conductive film. The transparent conductive film may be also in two layers composed of a relatively thin tin dioxide film and a relatively thick ITO film thereby to lower the resistance of transparent conductive film and to obtain a superior a-Si thin film having no impurity particles therein. A plurality of a-Si photoelectric conversion portions may be formed on the same substrate, and are connected in series with one another, to increase the output voltage thereof. The a-Si photoelectric conversion portions may be formed as forward junction and/or reverse junction types. The a-Si solar battery of this invention is flexible because of use of a metal foil with thickness of 10 to 250 μm such as stainless steel, aluminum or iron as the substrate thereof, so that it can be easily attached to a product having a curved surface thereon, such as an automobile or the like. Further, there are no problems or disadvantages, such as spallings and cracks of the a-Si thin film, or deterioration of the physical properties thereof, so that the a-Si solar battery of this invention can provide excellent conversion efficiency.

8 Claims, 9 Drawing Figures

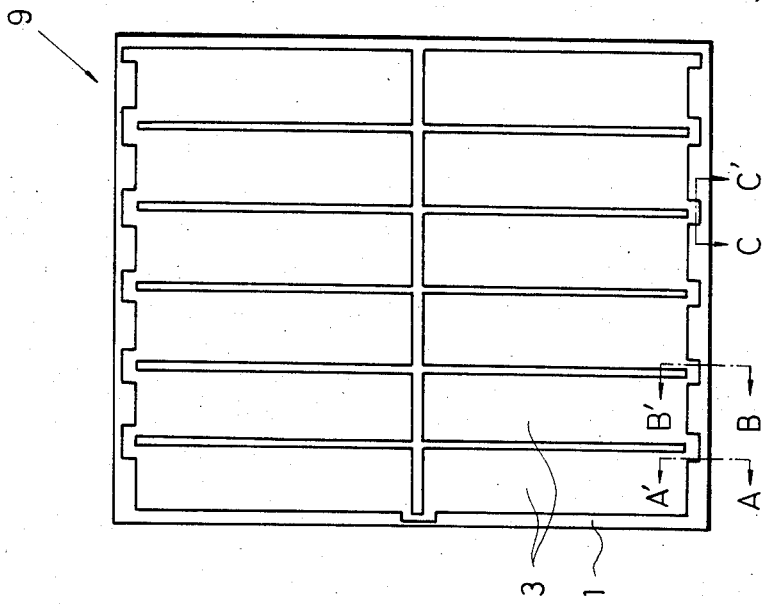
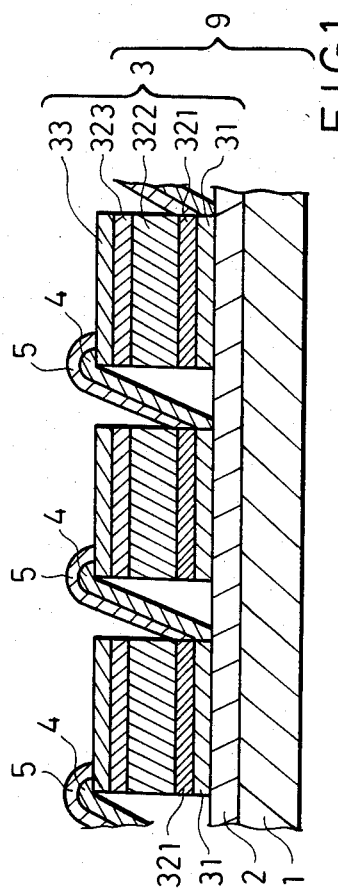
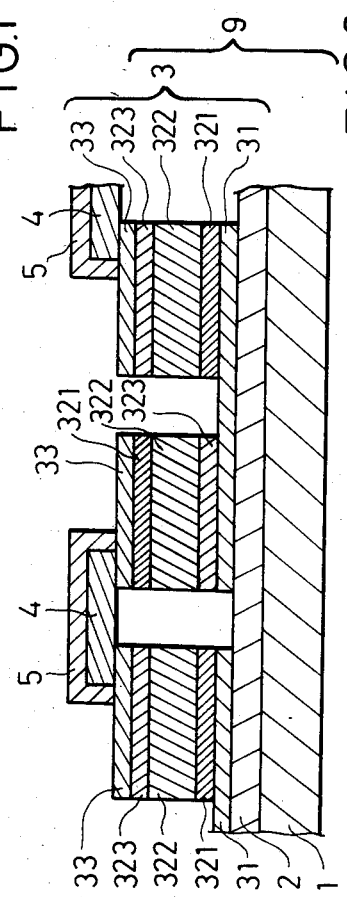
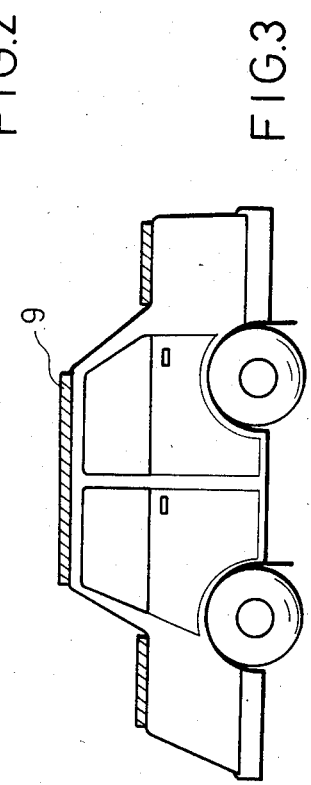

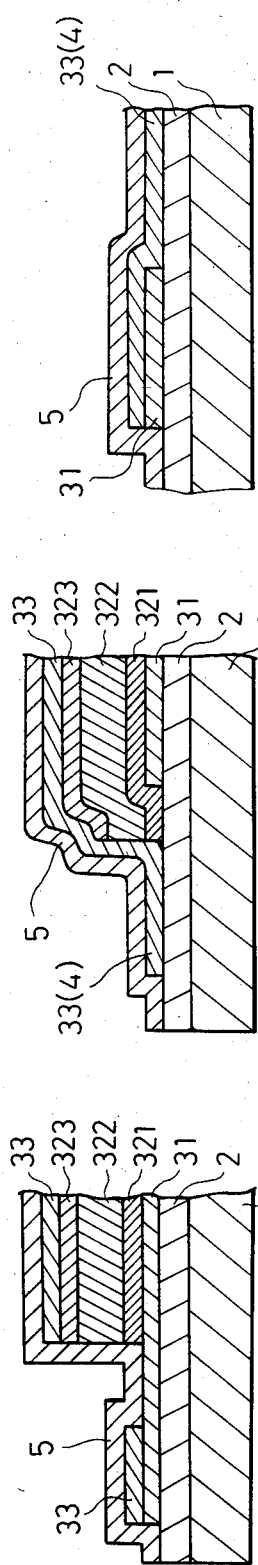
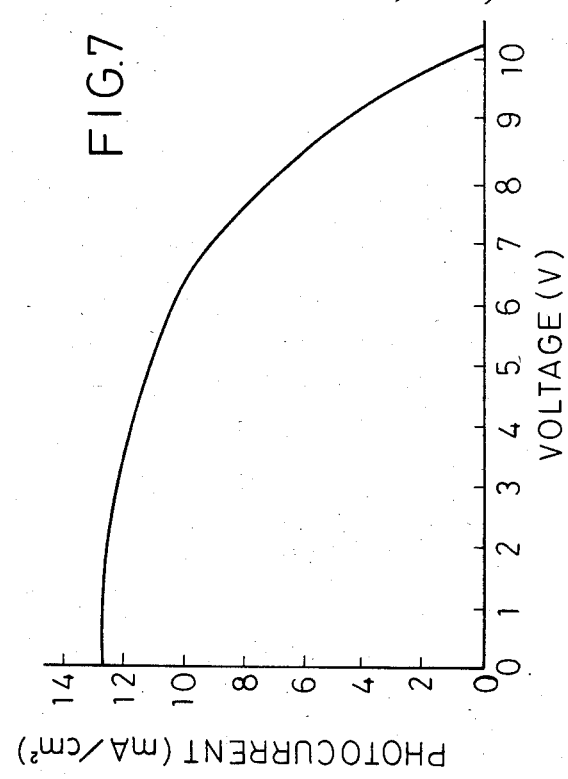
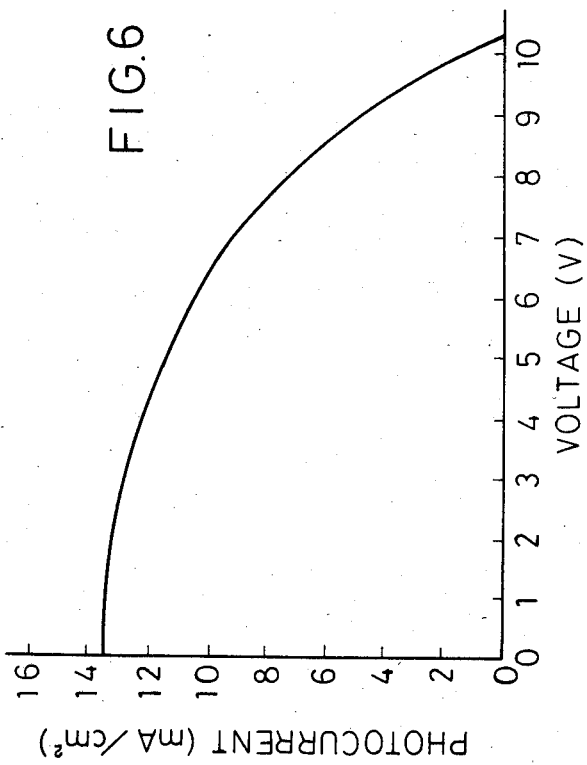

AMORPHOUS SILICON SOLAR BATTERY

This is a continuation of application Ser. No. 533,813, filed Sept. 19, 1983, which was abandoned upon the filing hereof.

BACKGROUND OF THE INVENTION

1. Field of the Invention

This invention relates to a flexible amorphous silicon solar battery.

2. Description of the Prior Art

The amorphous silicon solar battery is a photoelectric conversion device wherein electron-hole pairs generated by photon energy at the potential barrier in an amorphous silicon thin film layer are accelerated by the electric field of its potential barrier and outputted as a current to be supplied to an external circuit. (Hereinafter, amorphous silicon will be called "a-Si".) Usually when the a-Si solar battery is put to practical use, a plurality of a-Si photoelectric conversion portions are connected in series with one another to increase the output voltage thereof.

The a-Si solar battery has the advantages that it can be produced at low cost and the surface area thereof can be easily extended. Therefore, in recent years, the developments and studies thereof have been actively conducted.

Conventionally, a flexible a-Si solar battery in which the a-Si thin film layer is deposited on a heat resistant organic film, is known.

However, this conventional a-Si solar battery employing a heat-resistant organic film as a substrate thereof has the following disadvantages relating to production thereof.

First, there is remarkable difference between the heat resistant organic film and a-Si deposited thereon in their coefficients of thermal expansion. Therefore, when the a-Si thin film layer is deposited on the heated organic film by means of a glow discharge decomposition method, spallings, cracks, and the like are liable to occur on the deposited layer.

Secondly, when the a-Si thin film layer is deposited on the heated organic film by means of a glow discharge decomposition method, gas is evolved from the organic film thereby to deteriorating the physical properties of the deposited a-Si thin film layer.

SUMMARY OF THE INVENTION

The present invention have been made to overcome the aforesaid disadvantages in the conventional flexible a-Si solar battery and to provide a flexible a-Si solar battery which can be used on a product having a curved surface thereon, such as an automobile or the like, by attaching it thereto.

Accordingly, one object of the present invention is to provide a flexible a-Si solar battery employing a metal foil as the substrate thereof, which has no spallings and cracks in the a-Si thin film layer formed on the substrate.

Another object of the present invention is to provide a flexible a-Si solar battery which is free from deterioration of the physical properties thereof so that it can provide excellent conversion efficiency.

A further object of the present invention is to provide a flexible a-Si solar battery which prevents impurity particles from diffusing into the a-Si thin film layer thereof.

The foregoing and other objects are effected by the invention, as is apparent from the following description and claims.

DESCRIPTION OF THE DRAWINGS

FIG. 1 is a schematic sectional model view of an a-Si solar battery according to the present invention, in which only forward junction type a-Si photoelectric conversion portions are disposed;

FIG. 2 is a schematic sectional view of another a-Si solar battery according to the present invention, in which both forward junction and reverse junction a-Si photoelectric conversion portions are alternately disposed adjacent one another;

FIG. 3 is a view showing an a-Si solar battery according to the present invention attached to an automobile;

FIG. 4 is a plan view of an a-Si solar battery according to EXAMPLE 1 of this invention;

FIG. 5(A) is a sectional view taken along the line A–A' of FIG. 4;

FIG. 5(B) is a sectional view taken along the line B–B' of FIG. 4;

FIG. 5(C) is a sectional view taken along the line C–C' of FIG. 4;

FIG. 6 is a graph showing the output power characteristic of an a-Si solar battery according to EXAMPLE 1 of this invention; and FIG. 7 is a graph showing the output power characteristic of an a-Si solar battery according to EXAMPLE 2 of this invention.

DESCRIPTION OF THE PREFERRED EMBODIMENTS

An a-Si solar battery according to the present invention comprises a metal foil, an insulating layer integrally formed on the upper end face of the aforesaid metal foil and at least one a-Si photoelectric conversion portion formed on the aforesaid insulating layer.

The metal foil serves as a substrate for growing the a-Si photoelectric conversion portions thereon.

As the metal foil, a stainless steel foil, an aluminum foil, an iron foil, or the like can be employed. The thickness thereof is preferably thin in order to increase flexibility of the a-Si solar battery, such as about 10 $\mu$m to 250 $\mu$m.

The insulating layer serves to prevent the lower electrodes of a plurality of a-Si photoelectric conversion portions from being shorted to one another by the aforesaid metal foil. In addition, it also serves to prevent diffusion of impurities, such as sodium, potassium, calcium, and the like, into the a-Si photoelectric conversion portions.

As the insulating layer, amorphous silicon nitride, amorphous silicon oxide, amorphous silicon carbide, amorphous silicon, or the like can be employed.

The insulating layer can be deposited on the aforesaid metal foil by means of a glow discharge decomposition method, i.e. by plasma CVD. By the plasma CVD method, a-$Si_xN_yH_z$ is formed and the resulting silicon nitride contains hydrogen.

The a-Si photoelectric conversion portion has the function of a photovoltaic cell, and it has such a construction that the a-Si thin film having a region of internal electric field (i.e., potential barrier) therein is sandwiched between the lower electrode and an upper electrode thereon.

The lower electrode can be formed on the aforesaid insulating layer by evaporating aluminum, a nickel-chromium alloy, molybdenum, platinum, palladium, silver, or the like thereon by means of electron beam evaporation, sputtering, or the like. The a-Si thin film is grown on the aforesaid lower electrode by means of a glow discharge decomposition method.

In this case, the potential barrier in the a-Si thin film may be formed by a junction between an n-type silicon layer, an i-type silicon layer, and a p-type silicon layer, or it may be formed as Schottky barrier. In other words, it is necessary to form a potential barrier, by which electrons and holes can be accelerated so as to be separated from each other, in the a-Si thin film layer.

The upper electrode is formed on the light receiving surface of the solar battery and therefore must be transparent.

As the upper electrode, a transparent conductive film, such as an ITO film, which is a mixture of indium oxide and tin dioxide, a film of tin dioxide, or the like, may be employed. The transparent conductive film is evaporated on the a-Si thin film by means of electron beam evaporation, sputtering, or the like. Particularly, the transparent conductive film may be formed as two layers. These two layers consist of a relatively thin tin dioxide film and a relatively thick ITO film in that order from the side of the a-Si thin film layer. Deposition of tin dioxide does not deteriorate the physical properties of the a-Si thin film and ITO has a lower resistance than that of tin dioxide. Therefore, in order to lower the resistance of the transparent conductive film and obtain a superior a-Si thin film with no impurities therein, it is preferable that the transparent conductive film be formed of the aforesaid two layers.

Usually, a plurality of a-Si photoelectric conversion portions are formed on the same substrate and they are connected in series with one another to increase the output voltage thereof. For example, as shown in FIG. 1, a plurality of forward junction type a-Si photoelectric conversion portions, each of which consists of a p-type silicon layer, an i-type silicon layer, and an n-type silicon layer laminated in that order from the side of light receiving surface of the solar battery, are formed on the same metal foil substrate. Series electrical connection may be obtained when the upper electrode of one photoelectric conversion portion is connected by a lead wire to the lower electrode of the adjacent one on its left side in the figure. Or, as shown in FIG. 2, forward junction type a-Si photoelectric conversion portions and reverse junction type a-Si photoelectric conversion portions are alternately disposed adjacent to one another. The aforesaid reverse junction type conversion portion consists of an n-type silicon layer, an i-type silicon layer, and a p-type silicon layer which are laminated in that order from the light receiving side of the battery. Series electrical connection may be obtained when the upper electrode of a forward junction type portion is connected by a lead wire to that of the reverse type conversion portion adjacent its right side, and the lower electrode of the aforesaid forward junction type conversion portion is connected by a lead wire to that of another reverse type conversion portion adjacent its left side.

The a-Si solar battery having the aforesaid construction according to the present invention is flexible because it employs a metal foil as the substrate thereof. Therefore, the a-Si solar battery according to the present invention can be easily attached to a product having a curved surface thereon, such as an automobile or the like and is very useful when mounted thereon. Moreover, the metal foil, the insulating layer formed thereon and the a-Si thin film formed on the insulating layer have only small differences in their coefficients of thermal expansion and therefore, there are no problems or disadvantages of spallings and cracks of the a-Si thin film layer occurring during the production thereof, but which disadvantages have existed in the conventional a-Si solar battery employing a heat resistant organic film as the substrate thereof. In addition, gas which is generated from the heat resistant organic film is not generated from the metal foil. Therefore, the physical properties of an a-Si thin film layer according to the present invention are not deteriorated, thereby providing excellent conversion efficiency.

In the case when the forward and reverse junction types of a-Si photoelectric conversion portions are alternately disposed adjacent to one another, it is advantageous to evaporate lead wires to the respective electrodes.

Hereinafter, the present invention will be explained in accordance with examples thereof with reference to the accompanying drawings.

FIG. 1 is a schematic sectional view of an a-Si solar battery 9 according to EXAMPLES of the present invention, which will be explained hereinafter. FIG. 4 is a plan view of an a-Si solar battery 9 of EXAMPLE 1. FIG. 5(A) is a sectional view taken along the line A-A' of FIG. 4, FIG. 5(B) is a sectional view taken along the line B-B' of FIG. 4 and FIG. 5(C) is a sectional view taken along the line C-C' of FIG. 4. FIG. 3 is a view showing the a-Si solar battery 9 attached to an automobile.

EXAMPLE 1

The a-Si solar battery 9 as shown in FIGS. 1, 4 and 5 was produced in accordance with the following procedures.

(1) As a metal foil 1, a stainless steel foil having a thickness of 50 to 80 μm and an area of 10 cm×10 cm square was prepared. The stainless steel foil was subjected to ultrasonic washing, electrolytic polishing and ultrasonic washing again. Amorphous silicon nitride insulating layer 2 having a resistivity of $10^{10}$ to $10^{13} \Omega$ cm was then deposited on the resulting stainless steel foil by means of a glow discharge decomposition method, utilizing a high frequency power source of 13.56 MHz. The thickness thereof was 0.05 to 0.2 μm. As gases for this purpose, silane ($SiH_4$) and ammonia ($NH_3$) or nitrogen ($N_2$) were employed. The treating conditions thereof were such that the degree of vacuum was 0.5 to 1 Torr, the high frequency power density was 1 to 80 mW/cm² and the temperature of the stainless steel foil was 270° to 300° C.

(2) A mask of a predetermined pattern was placed on the aforesaid amorphous silicon nitride and then as lower electrodes 31 of a nickel-chromium alloy were evaporated thereon to a thickness of 500 to 2500 Å by means of an electron beam evaporation method. The aforesaid mask had a pattern such that twelve electrodes, each of which was 1.6 cm×4.9 cm square, were able to be formed on the aforesaid amorphous silicon nitride insulating layer.

(3) Employing another mask of different pattern than that of the preceding step (2), an n-type a-Si thin film 321 was grown on the aforesaid lower electrode 31 by means of a glow discharge decomposition method. The thickness thereof was 300 to 500 Å. As the gas for this purpose, a mixed gas was adopted. The composition ratio thereof was silane ($SiH_4$):phosphine ($PH_3$):argon (Ar)=10:0.01–0.3:90. The treating conditions thereof were as follows; the degree of vacuum was 0.1 to 1 Torr, the high frequency power density was 1 to 80 $mW/cm^2$ and the temperature of stainless steel foil was 270° to 300° C.

(4) Employing the same mask as in the preceding step (3), an i-type a-Si thin film 322 was grown on the aforesaid n-type a-Si thin film 321 to a thickness of 0.5 to 0.8 $\mu$m by means of a glow discharge decomposition method. As the gas employed for this purpose, a mixed gas was adopted. The composition ratio thereof was silane ($SiH_4$):argon (Ar)=10:90. The degree of vacuum, the high frequency power density and the temperature of the stainless steel foil were the same as in the preceding step (3).

(5) Employing the same mask as in the preceding steps (3) and (4), a p-type a-Si thin film 323 was grown on the aforesaid i-type a-Si thin film 322 to a thickness of 100 to 300 Å by means of a glow discharge decomposition method. As the gas employed for this purpose, a mixed gas having the following composition ratio was adopted. Silane ($SiH_4$):diborane ($B_2H_6$):methane ($CH_4$):argon (Ar)=10:0.01–0.3:2–4:86–88. The degree of vacuum, the high frequency power density and the temperature of stainless steel foil were the same as those in the preceding step (3).

(6) Employing still another mask having a different pattern than those in the preceding steps (2) and (3), an ITO film (consisting of a mixture of indium oxide and tin dioxide) was deposited on the aforesaid p-type a-Si thin film 323 to form a transparent conductive film for upper electrodes 33 and lead wires 4. The deposition thickness thereof was 1000 to 3000 Å.

(7) A protective coating 5 made of an transparent organic film was formed on the surface of the solar battery.

As described above, twelve photoelectric conversion portions 3 of forward junction type were formed on the same stainless steel foil and connected in series with one another thereby to produce an a-Si solar battery 9.

The a-Si solar battery 9 according to this EXAMPLE 1 showed a open-circuit voltage of 10.5 V under irradiation of AMI, a short-circuit photocurrent density of 13.5 $mA/cm^2$, a fill factor of 0.55 and conversion efficiency of 6.46%. In addition, the output power characteristic thereof was as shown in FIG. 6.

EXAMPLE 2

In accordance with the following procedures, tweleve a-Si photoelectric conversion portions 3 of forward junction type were formed on the same substrate made of stainless steel foil and connected in series with one another to produce an a-Si solar battery 9 according to EXAMPLE 2.

(1) As a metal foil, the same stainless steel foil as that in EXAMPLE 1 was employed and it was washed in the same manner as in EXAMPLE 1. Thereafter, amorphous silicon oxide was deposited on the aforesaid stainless steel foil as an insulating layer 2 by means of a glow discharge decomposition method. The deposition thickness thereof was 0.05 to 0.2 $\mu$m. As gases employed for this purpose, silane ($SiH_4$) and nitrogen oxide ($N_2O$) were employed. The degree of vacuum, the high frequency power density, and the temperature of stainless steel foil were the same as those in EXAMPLE 1.

(2) The same mask as that used in EXAMPLE 1 was placed on the aforesaid amorphous silicon oxide and then aluminum was deposited thereon to a thickness of 1000 to 2000 Å by means of sputtering to form lower electrodes 31.

(3) Employing another mask having a different pattern than that of the mask used in the aforesaid step (2), an n-type a-Si thin film 321 of a thickness of 300 to 500 Å was grown on the aforesaid lower electrodes 31 by means of a glow discharge decomposition method, in the same manner as in EXAMPLE 1. Subsequently, an i-type a-Si thin film 322 was grown on the aforesaid n-type a-Si thin film 321 with thickness of 0.5 to 0.8 $\mu$m.

(4) Employing the same mask as in the preceding step (3), a p-type a-Si thin film 323 of a thickness of 100 to 300 Å was grown on the aforesaid i-type a-Si thin film 322 by means of a glow discharge decomposition method. As a gas for this purpose, a mixed gas was employed. The composition ratio thereof was silane ($SiH_4$):diborane ($B_2H_6$):argon (Ar)=10:0.1–0.3:90. The degree of vacuum, the high frequency power density, and the temperature of stainless steel foil were the same as those in EXAMPLE 1.

(5) Employing still another mask having a different pattern than that of the mask used in the preceding steps (2), (3), and (4), tin dioxide was deposited on the aforesaid p-type a-Si thin film 323 and subsequently, ITO was also deposited on the tin dioxide by means of sputtering to form upper electrodes 33 and lead wires 4 thereon. The deposition thicknesses of tin dioxide and ITO were 500 to 1000 Å and 500 to 3000 Å, respectively.

(6) The aforesaid lead wires 4 were covered with a protective coat 5 made of an organic film.

As described above, an a-Si solar battery according to EXAMPLE 2 was produced.

The a-Si solar battery according to this EXAMPLE 2 showed an open-circuit voltage of 10.2 V under irradiation of AMI, a short-circuit photocurrent density of 13.2 $mA/cm^2$, a fill factor of 0.57. and a conversion efficiency of 6.4%. In addition, the output power characteristic thereof was as shown in FIG. 7.

EXAMPLE 3

EXAMPLE 3 was almost the same as EXAMPLE 1, except for the following points. Namely, as a metal foil 1, an iron foil having a thickness of 80 to 120 $\mu$m was employed. As an insulating layer 2, amorphous silicon carbide was employed. In addition, the aforesaid amorphous silicon carbide was deposited on the iron foil by means of a glow discharge decomposition method. As a gas for this purpose, a mixed gas having the following composition ratio was employed. Silane ($SiH_4$):methane ($CH_4$) argon (Ar)=10:4–10:80–86.

An a-Si solar battery according to this EXAMPLE 3 showed open-circuit voltage of 10.6 V, short-circuit photocurrent density of 13.4 $mA/cm^2$, fill factor of 0.51, and conversion efficiency of 6.01.

Accordingly, this invention is summarized as follows: the a-Si solar battery of the present invention comprises a metal foil, an insulating layer integrally formed on the aforesaid metal foil and at least one a-Si photoelectric conversion portion formed on the aforesaid insulating layer. In the case that a plurality of a-Si photoelectric conversion portions are formed on the substrate, they are connected in series with one another.

Since the a-Si solar battery according to the present invention employs a metal foil as the substrate thereof, it is more flexible. In addition, there are no large differences among the metal foil, insulating layer and a-Si thin film in their coefficients of thermal expansion. Therefore, spallings and cracks of the a-Si thin film do not occur even when the metal foil is heated while producing the solar battery. Moreover, since no gas is generated from the metal foil, deterioration of the physical properties of a-Si thin film can be prevented. As a result, the a-Si solar battery according to the present invention can provide excellent physical properties as described in the preceding EXAMPLES in detail.

Also, as shown in FIG. 2, when forward and reverse junction types of a-Si photoelectric conversion portions are alternately disposed adjacent to one another, these portions thus disposed can be easily connected. Further, the isolating area between adjacent a-Si photoelectric conversion portions can be reduced; therefore the effective light receiving area thereof can be increased.

What is claimed as new and intended to be covered by Letters Patent is:

1. A flexible amorphous silicon solar battery for attaching to a curved body portion comprising:
    a metal foil as the substrate thereof;
    an insulating layer which is amorphous silicon nitride containing hydrogen formed on said metal foil integrally by plasma chemical vapor deposition, the thickness of which is 0.05–0.2 $\mu$m; and
    at least one amorphous silicon photoelectric conversion portion formed on said insulating layer.

2. An amorphous silicon solar battery according to claim 1, wherein:
    said metal foil is selected from the group consisting of stainless steel foil, aluminum foil, and iron foil.

3. An amorphous silicon solar battery according to claim 1, wherein:
    said amorphous photoelectric conversion portion comprises:
    a lower electrode formed on said insulating layer;
    an amorphous silicon thin film having a potential barrier therein, formed on said lower electrode; and
    an upper electrode composed of one or more transparent conductive films, formed on said amorphous silicon thin film.

4. An amorphous silicon solar battery according to claim 3, wherein:
    a plurality of said amorphous photoelectric conversion portions are sectionally formed on the surface of the same substrate thereof and connected in series with one another.

5. An amorphous silicon solar battery according to claim 4, wherein:
    said amorphous silicon thin film having a potential barrier therein is composed of forward junction and reverse junction types of amorphous silicon photoelectric conversion portions;
    each of said forward junction type of amorphous silicon photoelectric conversion portions is composed of a p-type silicon layer, an i-type silicon layer and an n-type silicon layer laminated in that order from the side of the light receiving surface of the battery;
    each of said reverse junction type of amorphous silicon photoelectric conversion portions is composed of an n-type silicon layer, an i-type silicon layer and a p-type silicon layer laminated in that order from the side of the light receiving surface of the battery; and
    said forward and reverse junction types of amorphous silicon photoelectric conversion portions are alternately disposed adjacent to one another.

6. An amorphous silicon solar battery according to claim 1, wherein:
    said upper electrode is composed of a tin dioxide film of 500–1000 Å and a ITO film of 500–3000 Å which are laminated in that order from the side of the amorphous silicon thin film.

7. An amorphous silicon solar battery according to claim 1, wherein:
    said metal foil has a thickness of 50 to 80 $\mu$m.

8. An amorphous silicon solar battery according to claim 1, wherein:
    said amorphous silicon solar battery is attached on the outside surface of the body of an automobile.

* * * * *